United States Patent
Park (10) Patent No.: US 9,480,174 B2
(45) Date of Patent: Oct. 25, 2016

(54) FLEXIBLE DISPLAY DEVICE

(71) Applicant: Samsung Display Co., Ltd., Yongin, Gyeonggi-do (KR)

(72) Inventor: Sung-Un Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 263 days.

(21) Appl. No.: 14/037,051

(22) Filed: Sep. 25, 2013

(65) Prior Publication Data

US 2014/0104762 A1    Apr. 17, 2014

(30) Foreign Application Priority Data

Oct. 11, 2012  (KR) ..................... 10-2012-0113009

(51) Int. Cl.
*G06F 1/16* (2006.01)
*H05K 5/00* (2006.01)
*H05K 5/02* (2006.01)
(Continued)

(52) U.S. Cl.
CPC .......... *H05K 5/0017* (2013.01); *G06F 1/1652* (2013.01); *H05K 5/0217* (2013.01); *G02F 1/133305* (2013.01); *G02F 1/133308* (2013.01); *G02F 2001/133331* (2013.01); *G02F 2001/133388* (2013.01); *G09F 9/301* (2013.01);
(Continued)

(58) Field of Classification Search
CPC ................... G02F 1/133305; G02F 1/133308; G02F 2001/133331; G02F 2001/133388; G06F 1/1652; H01L 2251/5338; H05K 1/028; H05K 1/0281; H05K 5/0017; G09F 9/301; H04M 1/0268

USPC .......... 361/679.21, 679.26, 749; 349/58, 60; 362/19

See application file for complete search history.

(56) References Cited

U.S. PATENT DOCUMENTS

| 2005/0117197 A1* | 6/2005 | Ide ........................ G02F 1/1333 359/291 |
| 2010/0073593 A1* | 3/2010 | Sasaki .................... B29D 11/00 349/58 |

(Continued)

FOREIGN PATENT DOCUMENTS

| EP | 2 192 750 A2 | 6/2010 |
| JP | 2009-020168 A | 1/2009 |
| JP | 2010-156784 A | 7/2010 |
| KR | 10-2008-0051633 A | 6/2008 |

OTHER PUBLICATIONS

Extended European Search Report dated Apr. 10, 2014 for European Patent Application No. EP 13 188 234.2 which shares priority of Korean Patent Application No. KR 10-2012-0113009 with captioned U.S. Appl. No. 14/037,051, and cites above-identified reference Nos. 1-3.

*Primary Examiner* — James Wu
(74) *Attorney, Agent, or Firm* — Knobbe, Martens, Olson & Bear, LLP (57) ABSTRACT

A flexible display device is disclosed. In one aspect, the device includes: a bracket formed in the shape of a plate and forming curved portions in lateral sides, a flexible display panel disposed in an outer side of the bracket and attached to the curved portions and a cover window disposed in an outer side of the flexible display panel. The device further includes a polarizing plate disposed between the flexible display panel and the cover window and thus attached to the curved portions from an outer edge of the flexible display panel. According to some embodiments, the display device can firmly maintain a cover window, a polarizing plate, and a flexible display panel in a bent state.

12 Claims, 7 Drawing Sheets

(51) Int. Cl.
  *G02F 1/1333* (2006.01)
  *H05K 1/02* (2006.01)
  *H04M 1/02* (2006.01)
  *G09F 9/30* (2006.01)

(52) U.S. Cl.
  CPC ............ *H04M 1/0268* (2013.01); *H05K 1/028* (2013.01); *H05K 1/0281* (2013.01)

(56) References Cited

U.S. PATENT DOCUMENTS

| | | |
|---|---|---|
| 2010/0182518 A1 | 7/2010 | Kirmse et al. |
| 2012/0212445 A1* | 8/2012 | Heikkinen ............ G06F 1/1626 345/174 |
| 2013/0044282 A1* | 2/2013 | Kuwabara ............. G02F 1/1333 349/96 |

* cited by examiner

FLEXIBLE DISPLAY DEVICE

RELATED APPLICATIONS

This application claims priority to and the benefit of Korean Patent Application No. 10-2012-0113009 filed in the Korean Intellectual Property Office on Oct. 11, 2012, the entire contents of which are incorporated herein by reference.

BACKGROUND

1. Field

The described technology generally relates to a flexible display device using a flexible display panel.

2. Description of the Related Technology

A flexible display device can display an image on a side surface thereof by using a flexible display panel. The flexible display device may be variously applied to mobile equipment such as a mobile phone, an ultra mobile PC, an electric book, an electric newspaper, and the like.

SUMMARY

One inventive aspect is a flexible display device that can firmly maintain a cover window, a polarizing plate, and a flexible display panel in a bent state.

Another aspect is a flexible display device which includes: a bracket formed in the shape of a plate and forming curved portions in lateral sides; a flexible display panel disposed in an outer side of the bracket and attached to the curved portions; a cover window disposed in an outer side of the flexible display panel; and a polarizing plate disposed between the flexible display panel and the cover window and thus attached to the curved portions from an outer edge of the flexible display panel.

The curved portions may be formed externally convex from lateral sides, and may include a first curved portion connected to one plane side and having a first curvature radius and a second curved portion having a second curvature radius that is greater than the first curvature radius and connected to the first curved portion.

An end of the flexible display panel may be attached to the first curved portion and an end of the polarizing plate may be attached to the second curved portion while covering the end of the flexible display from an outer edge thereof.

The flexible display device may further include a touch panel disposed between the polarizing plate and the cover window.

The bracket may form a step portion between the first curved portion and the second curved portion.

The step portion may be greater than the thickness of the flexible display panel in a curvature radius direction.

The flexible display device may further include a touch panel disposed between the flexible display device and the polarizing plate.

The bracket may form a step portion between the first curved portion and the second curved portion, and the step portion may be greater than the sum of the thickness of the flexible display panel and the thickness of the touch panel in the curvature radius direction.

An end of the flexible display panel may be attached to the first curved portion, an end of the touch panel may be attached to the flexible display panel, and an end of the polarizing plate may be attached to the second curved portion while covering the end of the touch panel from an outer edge thereof.

The curved portion may further include a third curved portion formed internally concaved from lateral sides and connected to the second curved portion.

An end of the flexible display panel may be attached to the first curved portion, and an end of the polarizing plate may be attached to the second and third curved portions from an outer edge while covering the end of the flexible display panel.

DETAILED DESCRIPTION

Generally, a flexible display device has a cover window layered on the top to protect the flexible display panel. Also, a polarizing plate is provided between the cover window and the flexible display panel to partially absorb light incident from the flexible display panel so that visibility can be improved in the external light state.

To form the flexible display device, the cover window with a predetermined curvature radius to correspond to a curvature radius of a bracket, the polarizing plate is laminated to an inner side of the bent cover window, the flexible display panel is attached to an inner side of the polarizing plate, and the flexible display panel is attached to the bracket.

In such a flexible display device, the polarizing plate and the flexible display panel tends to return to its original flat state from the bent state, that is, a characteristic of spring back.

When the spring-back is continuously maintained, adherence in the respective interface between the cover window, the polarizing plate, the display panel, and the bracket are weakened so that interference separation occurs in a portion having the lowest interference adherence. Thus, it becomes difficult to maintain the adhered state of the interfaces.

Embodiments will be described more fully hereinafter with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Further, in the drawings, a size and thickness of each element are randomly represented for better understanding and ease of description, and the present invention is not limited thereto.

In the drawings, the thickness of layers, films, panels, regions, etc., may be exaggerated for clarity. In the drawings, for better understanding and ease of description, thicknesses of some layers and areas may be excessively displayed. It will be understood that when an element such as a layer, film, region, or substrate is referred to as being "on" another element, it can be directly on the other element or intervening elements may also be present.

Figure 1:
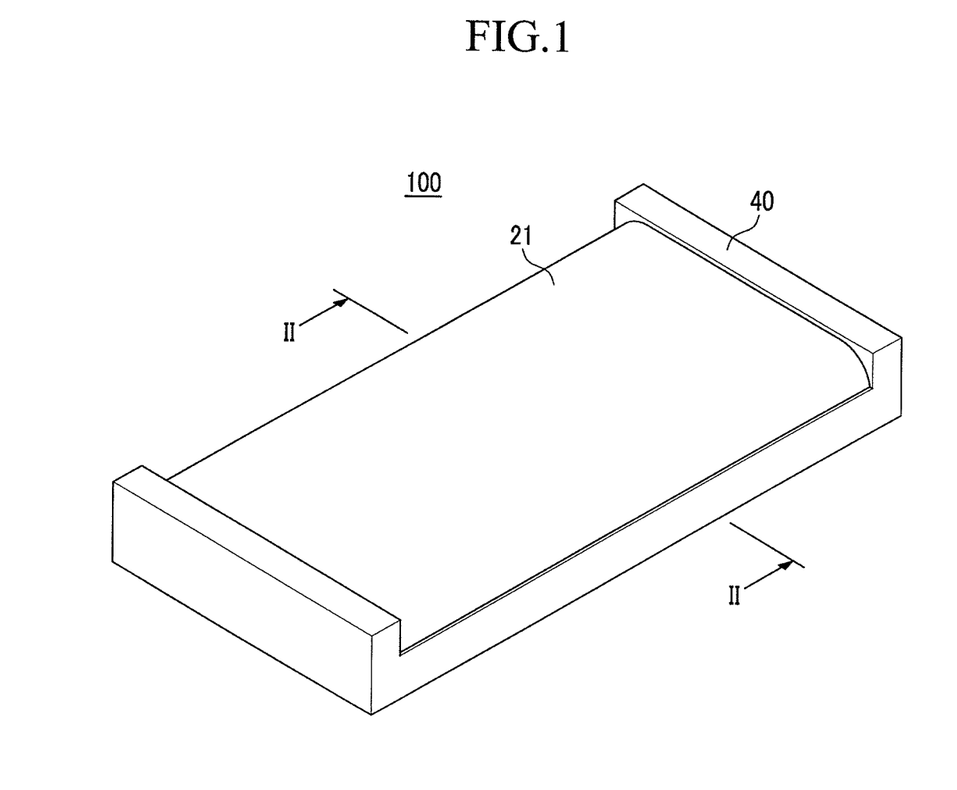
FIG. 1 is a perspective view of a flexible display device according to a first embodiment.
Figure 2:
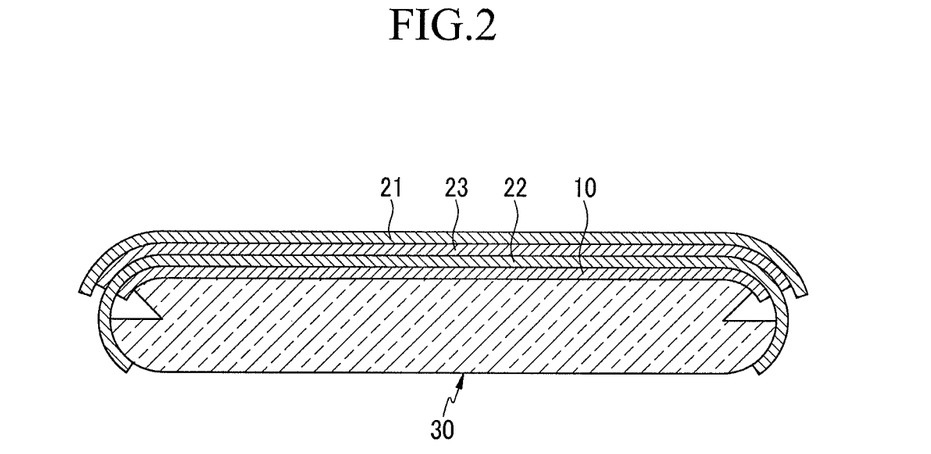
FIG. 2 is a partial cross-sectional view of the flexible display device of FIG. 1, taken along the line II-II.

FIG. 1 is a perspective view of a flexible display device according to a first embodiment, and FIG. 2 is a partial cross-sectional view of the flexible display device of FIG. 1, taken along the line II-II. Referring to FIG. 1 and FIG. 2, a flexible display device 100 includes a flexible display panel 10 and a cover window 21 overlapping the flexible display panel 10 to protect the flexible display panel 10 from external impact. The device 100 also includes a polarizing plate 22 disposed between the flexible display panel 10 and the cover window 21 to absorb part of light incident from the flexible display panel 10 for improvement of visibility in external light state.

The flexible display panel 10 may include a flexible film such as a plastic film, and displays an image by arranging an organic light emitting diode to and a pixel circuit on the flexible film. A detailed structure of the flexible display panel 10 will be described in further detail.

The cover window 21 is positioned outside the side on which an image is displayed in the flexible display panel 10 and is formed of a transparent and hard material to transmit the image of the flexible display panel 10 and to protect the flexible display panel 10 against external impact. The cover window 21 may be formed of a single-layered structure or a multi-layered structure. FIG. 2 exemplarily illustrates a single-layered cover window 21.

A touch panel 23 may be provided between the flexible display panel 10 and the cover window 21 to sense touch operation of a user. For example, the touch panel 23 may be disposed between the polarizing plate 22 and the cover window 21.

The flexible display panel 10, the polarizing plate 22, the touch panel 23, and the cover window 21 may be attached in a layered state to the bracket 30 and then fixed to the support body 40. The support body 40 fixes the bracket 30 and the flexible display panel 10, the polarizing plate 22, the touch panel 23, and the cover window 21 attached to the bracket 30 by surrounding the outer edges thereof.

In this case, the flexible display panel 10, the polarizing plate 22, the touch panel 23, and the cover window 21 are bent at lateral sides of the bracket 30 and attached to each other. For convenience, adhesive layers respectively provided between the flexible display panel 10, the polarizing plate 22, the touch panel 23, the cover window 21, and the bracket 30 are omitted. The bracket 30 firmly maintains the bent state of the layered flexible display panel 10, polarizing plate 22, touch panel 23, and cover window 21.

Figure 3:
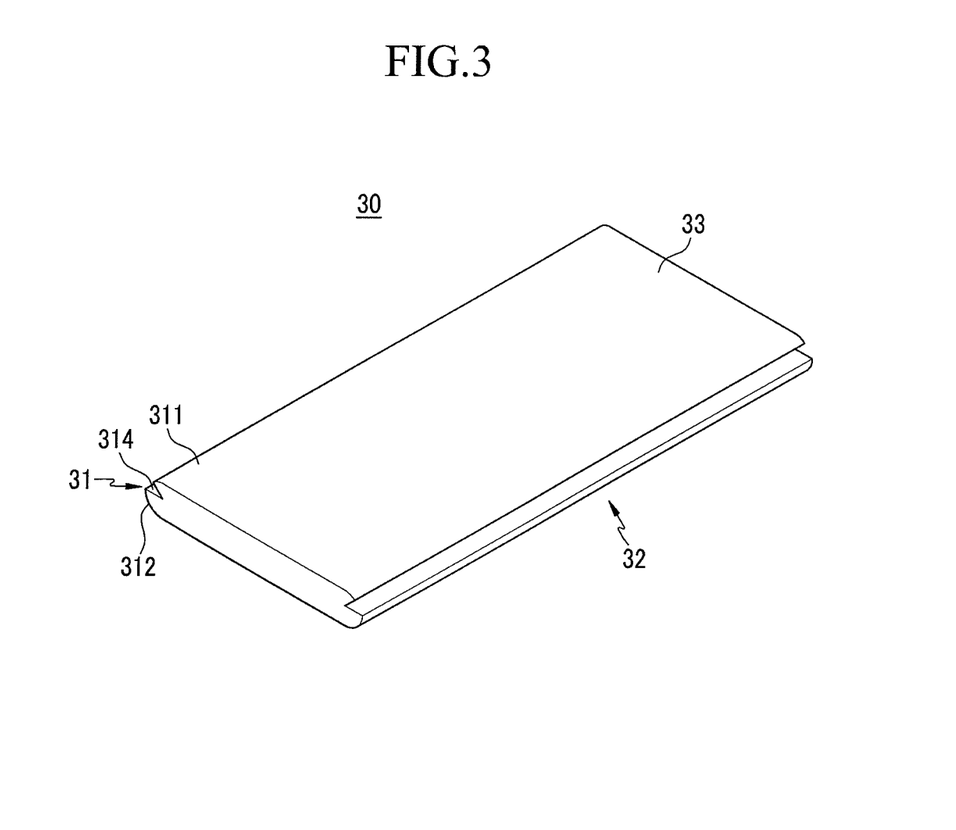
FIG. 3 is a perspective view of a bracket applied to FIG. 2.
Figure 4:
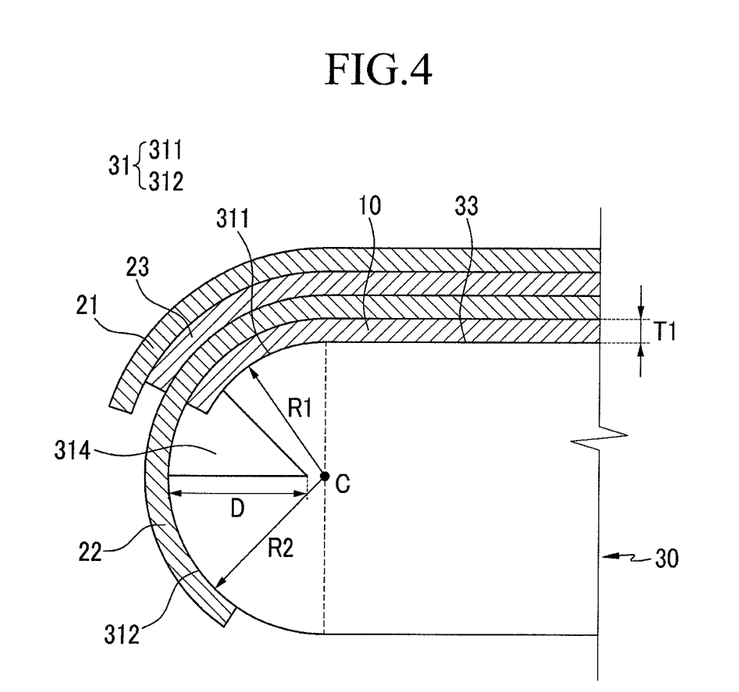
FIG. 4 is an enlarged cross-sectional view of one curved portion of the bracket applied to FIG. 2.

FIG. 3 is a perspective view of the bracket applied to FIG. 2 and FIG. 4 is an enlarged cross-sectional view of one curved portion 31 of the bracket applied to FIG. 2. Referring to FIG. 2 to FIG. 4, the bracket 30 is formed in the shape of a plate received in the support body 40, and curved portions 31 and 32 are formed at lateral sides of the bracket 30 so as to be fixed to the support body 40 by additional fixing members (not shown).

For convenience, the curved portion 31 in one side includes a first curved portion 311 and a second curved portion 312. The first and second curved portions 311 and 312 may be convex with respect to the same center C and connected with each other. The first curved portion 311 is connected to a plane 32 where the flexible display panel 10 is disposed and includes a first curvature radius R1. The second curved portion 312 includes a second curvature radius R2 that is greater than the first curvature radius R1, and is connected to the first curved portion 311.

The flexible display panel 10 is disposed in an outer side of the bracket 30 and then attached to the plane 33 and at the same time lateral ends thereof are attached to the curved portions 31 and 32 that are convex to the outer side. Thus, the flexible display panel 10 can display an image through the plane 33 and the curved portions 31 and 32 of the bracket 30. In this case, an end of the flexible display panel 10 is attached to the first curved portion 311.

The support body 40 opens the first curved portion 311 in order not to block an image displayed through the end of the flexible display panel 10 attached to the first curved portion 311. For example, the support body 40 opens the first curved portion 311 and covers the second curved portion 312.

The bracket 30 includes a step portion 314 formed between the first and second curved portions 311 and 312. The step portion 314 forms a larger step than a thickness T1 of the flexible display panel 10 in a curvature radius direction of the curved portion 31. For example, the step portion 314 may form a cut groove formed through the first and second curved portions 311 and 312 as the step portion 314. That is, a depth D of the cut portion is larger than the thickness T1.

Thus, the end of the flexible display panel 10, attached to the first curved portion 311 is received in the step portion 314 and thus does not protrude over the second curved portion 312. That is, when the polarizing plate 22 is attached to the second curved portion 312, the polarizing plate 22 can be prevented from being lifted from the second curved portion 312 by the support at the end of the flexible display panel 10.

The polarizing plate 22 is disposed in an outer side of the flexible display panel 10, that is, between the flexible display panel 10 and the cover window 21 and thus being attached to the curved portion 31 from an outer edge of the end portion of the flexible display panel 10. That is, the polarizing plate 22 is attached to the outer side of the flexible display panel 10 and at the same time attached to the second curved portion 312 from the outer edge of the end portion of the flexible display panel 10 while covering the end portion of the flexible display panel 10 with lateral end portions thereof.

That is, the flexible display panel 10 is attached to the first curved portion 311 having the first curvature radius R1 through the end bent with the first curvature, and the polarizing plate 22 is attached to the second curved portion 312 having the second curvature radius R2 through the end bent with the second curvature. In addition, due to a material to be used, spring-back of the polarizing plate 22 is greater than spring-back of the flexible display panel 10.

In the bent state, the flexible display panel 10 having a relatively less spring-back is attached to the first curved portion 311 having a small curvature radius, that is, the first curvature radius R1 and the polarizing plate 22 having a relatively strong spring-back is attached to the second curved portion 312 having a large curvature radius, that is, the second curvature radius R2. In addition, in the bent state, polarizing plate 22 has stronger spring-back than the touch panel 23 and the cover window 21, respectively.

Thus, the polarizing plate 22 is attached to the second curved portion 312 having a relatively large curvature rather than attached to the first curved portion 311 of the bracket 30 so that further firmly attached to the flexible display panel 10. That is, the end portion of the polarizing plate 22 is attached to the second curved portion 312 that causes a short spring-back so that it can maintain a strong interface adherence with the curved portion 31. In addition, the touch panel 23 and the cover window 21 are sequentially attached to the polarizing plate 22, thereby maintaining interface adherence.

Hereinafter, various embodiments will be described. In addition, the duplicative description for the same configuration as the first embodiment and the above-described embodiment will be omitted.

Figure 5:
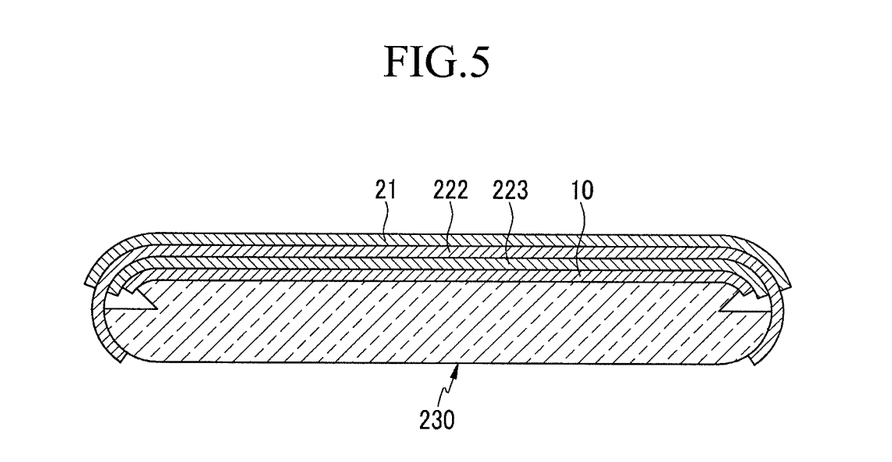
FIG. 5 is a partial cross-sectional view of a flexible display device according to a second embodiment.
Figure 6:
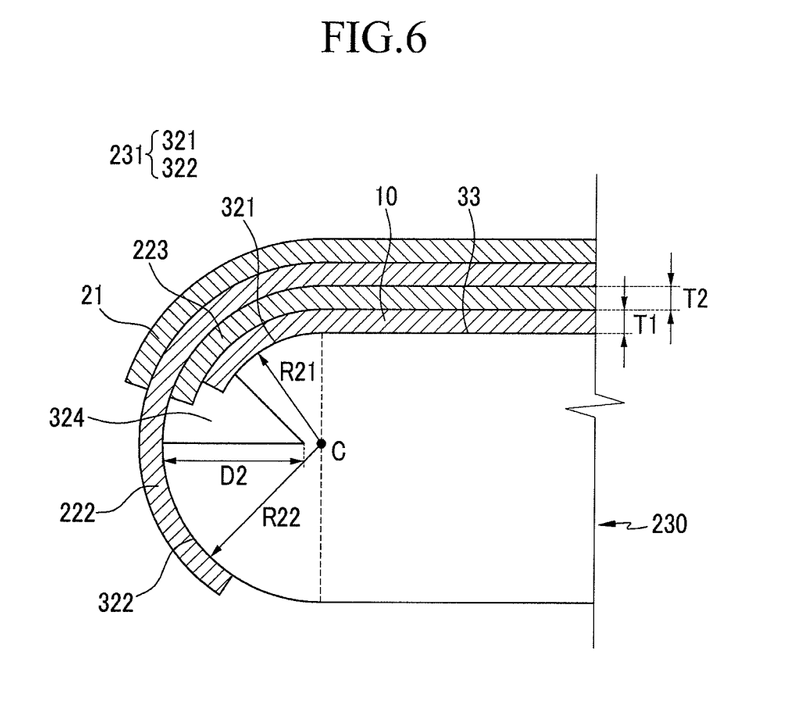
FIG. 6 is an enlarged cross-sectional view of one curved portion of a bracket applied to FIG. 5.

FIG. 5 is a partial cross-sectional view of a flexible display device according to a second embodiment and FIG. 6 is an enlarged cross-sectional view of one side curved portion 231 of a bracket applied to FIG. 5. Referring to FIG. 5 and FIG. 6, in the second embodiment, a touch panel 223 is disposed between a flexible display panel 10 and a polarizing plate 222.

A bracket 230 forms a step portion 324 between a first curved portion 321 and a second curved portion 322. The step portion 324 forms a step that is larger than the sum of the thicknesses T1 and T2 of the flexible display panel 10 and the tough panel 223. For example, the step may be formed of a cut groove formed through the first and second curved portions 321 and 322. That is, a depth D2 of the cut groove is larger than the thickness sum (T1+T2) of the thickness.

Thus, end portions of the touch panel 223 attached to an end portion of the flexible display panel 10 attached to the first curved portion 10 and an end portion of the touch panel 223 attached to the end portion of the flexible display panel 10 are received in the step portion 324 and do not protrude over the second curved portion 322.

That is, when the polarizing plate 222 is attached to the second curved portion 322, the polarizing plate 222 can be prevented from being lifted from the second curved portion 322 by the support at the end portions of the flexible display panel 10 and the touch panel 223.

The polarizing plate 222 is disposed in the outer side of the touch panel 223, that is, between the touch panel 223 and the cover window 21 and thus attached to the curved portion 231 from outer edges of the end portions of the flexible display panel 10 and the touch panel 223. That is, the polarizing plate 222 is attached to the outer side of the touch panel 223 and at the same time attached to the second curved portion 322 from the outer edge of the end portion of the touch panel 223 while covering the end portions of the touch panel 223 with lateral ends thereof.

That is, the layered touch panel 223 and flexible display panel 10 are attached to the first curved portion 321 having a first curvature radius R21 at the end portions bent with a first curvature, and the polarizing plate 222 is attached to the second curved portion 322 having a second curvature radius R22 at the end portion bent with a second curvature. In addition, due to a material to be used, spring-back of the polarizing plate 222 is stronger than spring-back of the flexible display panel 10.

In the bent state, the touch panel 223 and the flexible display panel 10 having relatively less strong spring-back are attached to the first curved portion 321 having a smaller curvature radius, that is, the first curvature radius R21, a polarizing plate 222 having strong spring-back is attached to the second curved portion 322 having a larger curvature radius, that is, the second curvature radius R22. In addition, in the bent state, the polarizing plate 222 has stronger spring-back than the cover window 21.

Thus, the polarizing plate 222 is attached to the second curved portion 322 having a relatively large curvature rather than attached to the first curved portion 321 of the bracket 230 so that further firmly attached to the flexible display panel 10. That is, the end portion of the polarizing plate 322 is attached to the second curved portion 332 that causes less strong spring-back so that it can maintain a strong interface adherence with the curved portion 231. In addition, the cover window 21 is attached to the polarizing plate 222, thereby maintaining interface adherence.

The flexible display panel 10 is disposed in the inner side of the polarizing plate 22 in the first embodiment, and the touch panel 223 and the flexible display panel 10 are disposed in the inner side of the polarizing plate 222 in the second embodiment.

In such a state, if the first curvature radiuses R1 and R2 of the first curved portions 311 and 321 of the first and second embodiments are equivalent to each other, the second curvature radius R2 of the second curved portion 322 of the second embodiment is larger than the second curvature radius R2 of the second curved portion 312 of the first embodiment.

Thus, interface adherence between an end of the polarizing plate 222 and the second curved portion 322 of the second embodiment may be stronger than interface adherence between an end of the polarizing plate 22 and the second curved portion 312 of the first embodiment.

Figure 7:
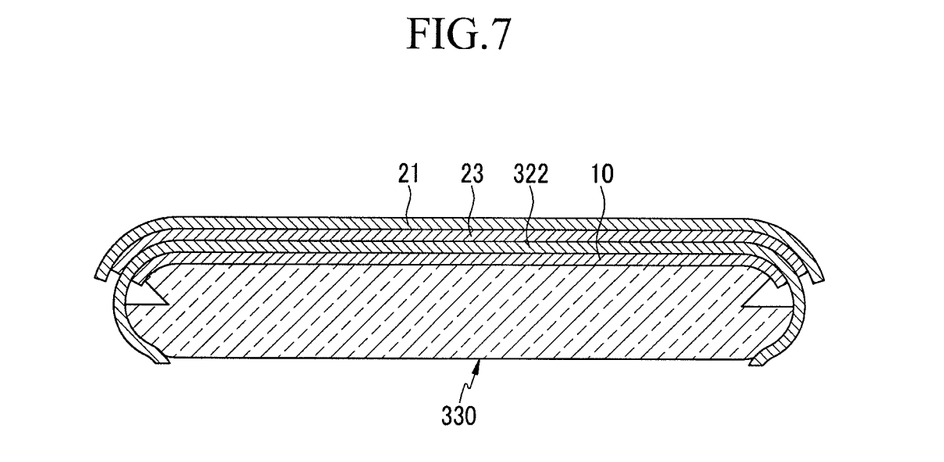
FIG. 7 is a partial cross-sectional view of a flexible display device according to a third embodiment.
Figure 8:
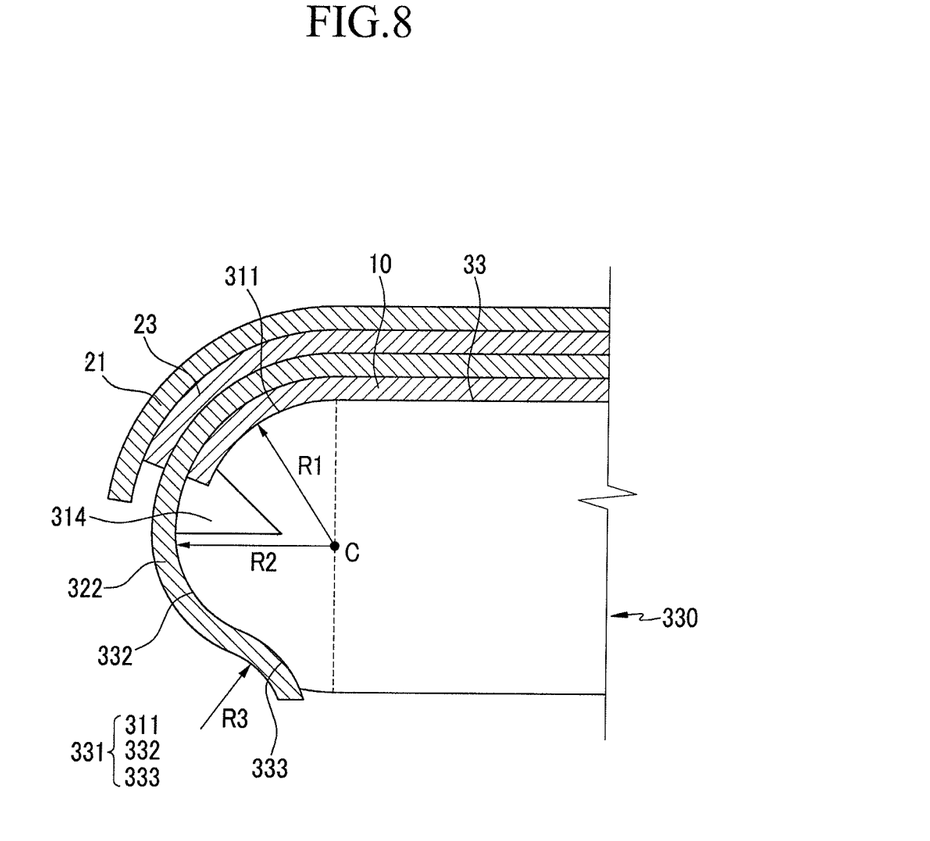
FIG. 8 is an enlarged cross-sectional view of one curved portion of a bracket applied to FIG. 7.

FIG. 7 is a partial cross-sectional view of a flexible display device according to a third embodiment and FIG. 8 is an enlarged cross-sectional view of one curved portion 331 of a bracket applied to FIG. 7. Referring to FIG. 7 and FIG. 8, the curved portion 331 according to the third embodiment further includes a third curved portion 333 having a third curvature radius R3 and connected to a second curved portion 332 having a second curvature radius R2 that is the same as that of the second curvature portion 312 of the first embodiment.

That is, first and second curved portions 311 and 332 are formed convex to an outer side of a bracket 330, and the third curved portion 333 is formed convex to an inner side of the bracket 330. The third curvature radius R3 may be larger than the second curvature radius R2.

The polarizing plate 322 is disposed in an outer side of a flexible display panel 10, that is, between the flexible display panel 10 and a cover window 21 and attached to the curved portion 331 from an outer edge of an end of the flexible display panel 10. That is, the polarizing plate 322 is attached to the external side of the flexible display panel 10 and at the same time covers the ends of the flexible display panel 10 with lateral ends thereof, and then attached to the second and third curved portions 332 and 333 from outer edges of the ends.

That is, the flexible display panel 10 is attached to the end bent with the first curvature radius to the first curved portion 311 that has the first curvature radius R1, the polarizing plate 322 is bent with the second curvature radius to the second curved portion 322 that has the second curvature radius R2 and then bent with the third curvature radius and sequentially attached to the third curved portion 333 that has the third curvature radius R3.

In the bent state, the flexible display panel 10 having relatively less strong spring-back is attached to the first curved portion 311 having a smaller curvature radius, that is, the first curvature radius R1, the polarizing plate 322 having strong spring-back is attached to the second curved portion 322 having a large curvature radius, that is, the second curvature radius R2 and then subsequently attached to the third curved portion 333 having the third curvature radius R3.

Thus, the polarizing plate 322 is attached to the second curved portion 332 having relatively a larger curvature radius rather than being attached to the first curved portion 311 of the bracket 330 and then further attached to the third curved portion 333 so that further stronger adherence can be maintained. That is, an end of the polarizing plate 322 can maintain strong interface adherence with the curved portion 331 by being attached to the second and third curved portions 332 and 333. In addition, the touch panel 23 and the cover window 21 are sequentially attached to the polarizing plate 322, thereby maintaining interface adherence.

Hereinafter, the flexible display panel 10 disposed in the outer side of the brackets 30, 230, and 330 of the first to third embodiments will be exemplarily described.

Figure 9:
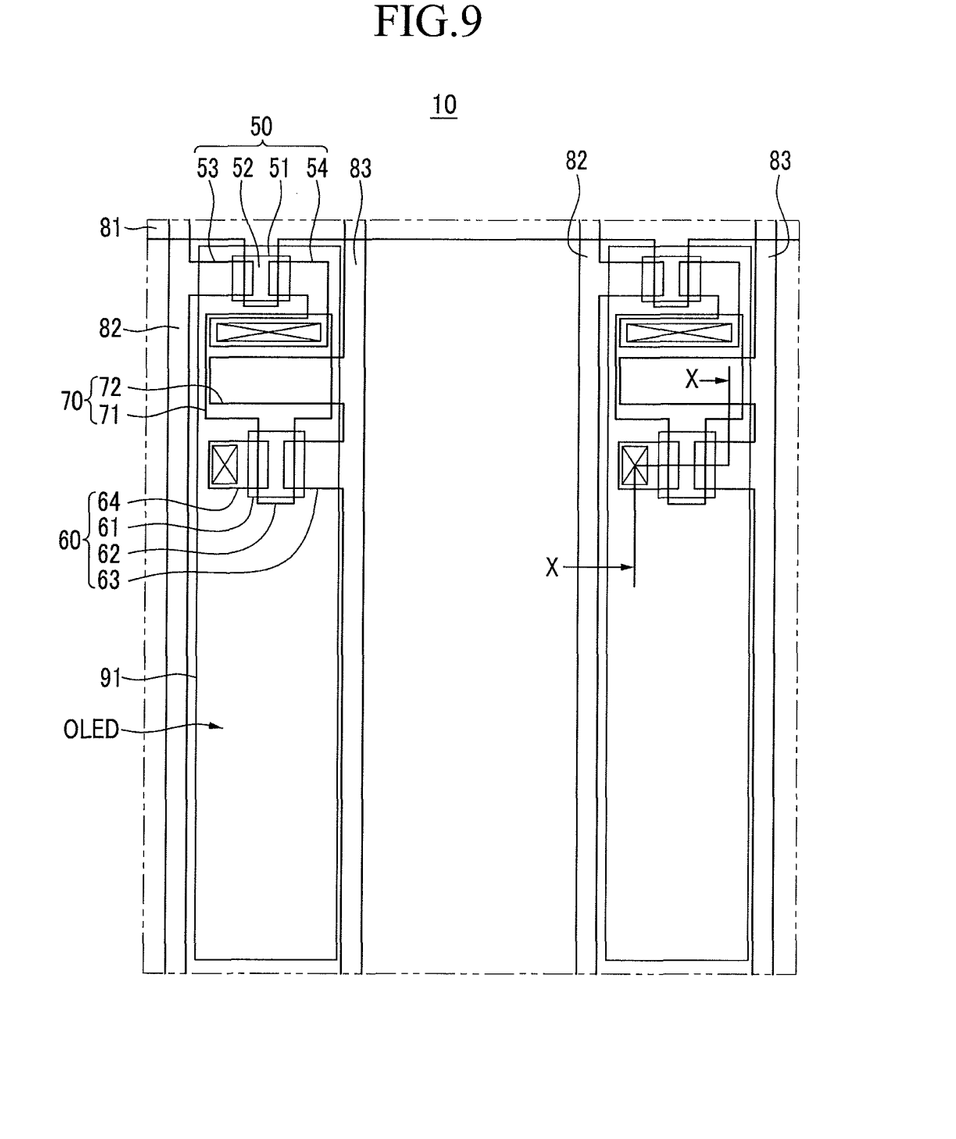
FIG. 9 is a layout view of a pixel structure of the flexible display panel of FIG. 2.
Figure 10:
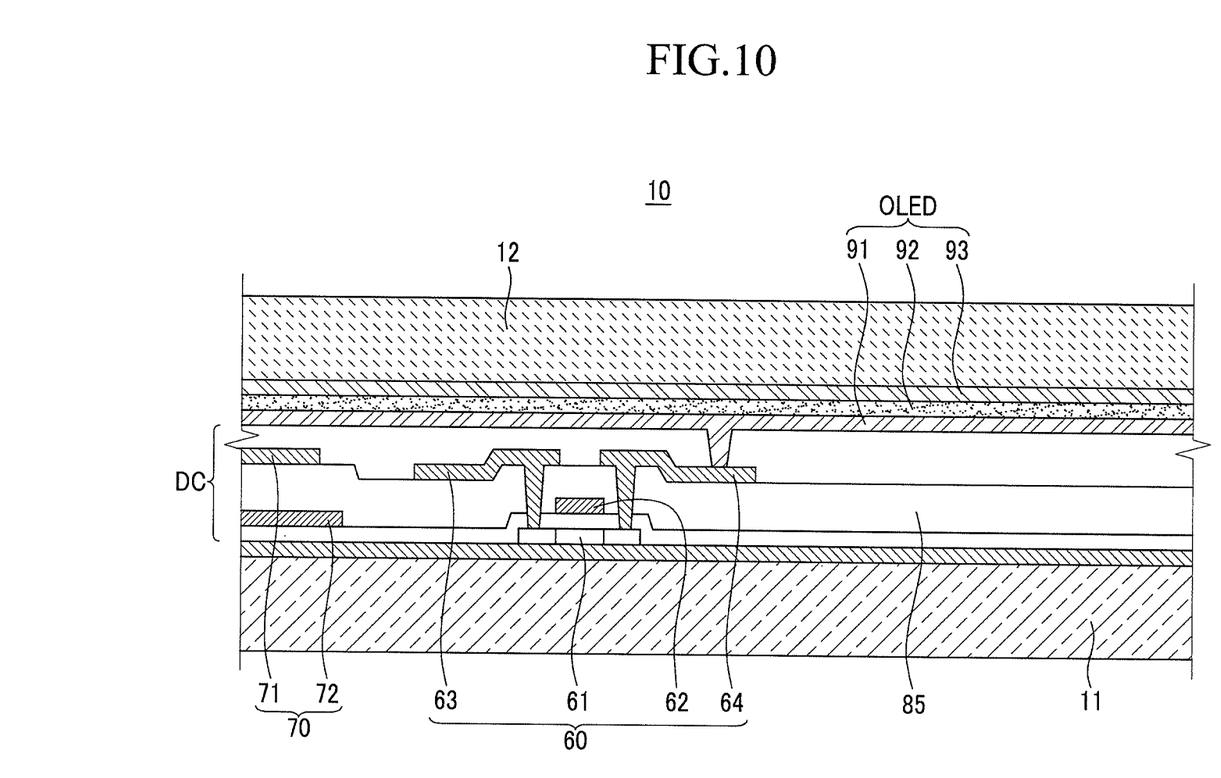
FIG. 10 is a cross-sectional view of the flexible display panel of FIG. 9, taken along the line X-X.

FIG. 9 is a layout view of a pixel structure of the flexible display panel of FIG. 2 and FIG. 10 is a cross-sectional view of the flexible display panel of FIG. 9, taken along the line X-X. The flexible display panel 10 is not limited to a structure to be described hereinafter, and may be formed of an organic light emitting diode (OLED) display or a flexible liquid crystal display (LCD) display having another structure.

Referring to FIG. 9 and FIG. 10, a flexible display panel 10 includes a pixel circuit DC and an organic light emitting diode OLED that are formed in each pixel. The pixel circuit DC basically includes a switching thin film transistor 50 and a driving thin film transistor 60 and capacitor 70. In addition, the flexible display panel 10 includes gate lines 81 arranged along one direction, and data lines 82 and common power lines 83 crossing the gate lines 81 in an insulated manner.

Here, one pixel may be defined as the boundary of the gate line 81, the data line 82, and the common power line 83, but the present invention is not limited thereto. The pixel means a basic unit that displays an image. The flexible display panel 10 displays an image through a plurality of pixels.

In FIG. 9, the active matrix flexible display panel 10 of a 2Tr-1 Cap structure in which two thin film transistors 50 and 60 and one capacitor 70 are provided in one pixel is illustrated. However, the structure of the flexible display panel 10 is not limited to the illustrated example. The flexible display panel 10 may include no less than three thin film transistors and no less than two capacitors. An additional wire may be further formed in the flexible display panel 10 so that the flexible display panel 10 may have various structures.

The organic light emitting diode (OLED) includes a pixel electrode 91, an organic emission layer 92, and a common electrode 93. One of the pixel electrode 91 and the common electrode 93 is a hole injection electrode and the other is an electron injection electrode. Light is emitted when electrons and holes are injected from the pixel electrode 91 and the common electrode 93 into the organic emission layer 92 and exciton in which the holes and the electrons are combined with each other is reduced from an exited state to a base state.

The pixel electrode 91 is formed of a metal having high reflectance and the common electrode 93 may be formed of a transparent conductive layer. In this case, the light of the organic emission layer 92 is reflected by the pixel electrode 91 and transmits the common electrode 93 and an encapsulation substrate 12 to be emitted to the outside. In FIG. 10, reference numeral 11 denotes a flexible substrate.

The capacitor 70 includes a pair of capacitor electrodes 71 and 72 disposed with an interlayer insulating layer 85 as a dielectric material interposed. Capacitance is determined by charge stored in the capacitor 70 and a voltage between the two capacitor electrodes 71 and 72.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching thin film transistor 50 is used as a switch for selecting a pixel to emit light. The switching gate electrode 52 is connected to the gate line 81. The switching source electrode 53 is connected to the data line 82 and the switching drain electrode 54 is connected to one capacitor electrode 71.

The driving thin film transistor 60 applies driving power by which the organic emission layer 92 of the selected pixel emits light to the pixel electrode 91. The driving gate electrode 62 is connected to the capacitor electrode 71 connected to the switching drain electrode 54. The driving source electrode 63 and the other capacitor electrode 72 are connected to the common power line 83. The driving drain electrode 64 is connected to the pixel electrode 91 of the organic light emitting diode (OLED) through a contact hole.

The switching thin film transistor 50 is driven by a gate voltage applied to the gate line 81 to transmit a data voltage applied to the data line 82 to the driving thin film transistor 60. A voltage corresponding to a difference between a common voltage applied from the common power line 83 to the driving thin film transistor 60 and a data voltage transmitted from the switching thin film transistor 50 is stored in the capacitor 70. A current corresponding to the voltage stored in the capacitor 70 flows to the organic light emitting diode (OLED) through the driving thin film transistor 60 so that the organic emission layer 92 emits light.

As described, according to at least one of the disclosed embodiments, a curved portion is provided in a bracket to attach a polarizing plate disposed in an outer side of a flexible display panel attached to the curved portion from an outer edge of an end of the flexible display panel to thereby remove spring-back of the polarizing plate.

Accordingly, adherence of interfaces between the cover window, the polarizing plate, the flexible display panel, and the bracket can be maintained. That is, the bent state of the cover window, the polarizing plate, and the flexible display panel with respect to the bracket can be firmly maintained.

While the above embodiments have been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:
1. A flexible display device comprising:
 a bracket having curved portions in lateral sides thereof;
 a flexible display panel disposed on an outer side of the bracket and attached to the curved portions of the bracket;
 a cover window surrounding an outer side of the flexible display panel; and
 a polarizing plate disposed between the flexible display panel and the cover window and covering the curved portions of the bracket, wherein the polarizing plate is longer than the cover window in a direction extending between the curved portions of the bracket, wherein the curved portions are convex with respect to the lateral sides of the bracket, and wherein the curved portions comprise a first curved portion connected to one plane side and having a first curvature radius and a second curved portion having a second curvature radius that is greater than the first curvature radius and connected to the first curved portion, and wherein an end of the flexible display panel is attached to the first curved portion and wherein an end of the polarizing plate is attached to the second curved portion while covering the end of the flexible display.

2. The flexible display device of claim 1, further comprising a touch panel disposed between the polarizing plate and the cover window.

3. The flexible display device of claim 1, wherein the bracket forms a step portion between the first curved portion and the second curved portion.

4. The flexible display device of claim 3, wherein the step portion is greater than the thickness of the flexible display panel in a curvature radius direction.

5. The flexible display device of claim 1, further comprising a touch panel disposed between the flexible display panel and the polarizing plate.

6. The flexible display device of claim 5, wherein the bracket forms a step portion between the first curved portion and the second curved portion, and wherein the step portion is greater than the sum of the thickness of the flexible display panel and the thickness of the touch panel in a curvature radius direction.

7. The flexible display device of claim 6, wherein an end of the flexible display panel is attached to the first curved portion, wherein an end of the touch panel is attached to the flexible display panel, and wherein an end of the polarizing plate is attached to the second curved portion while covering the end of the touch panel.

8. The flexible display device of claim 1, wherein the curved portion further comprises a third curved portion which is concave with respect to the lateral sides of the bracket and connected to the second curved portion.

9. The flexible display device of claim 8, wherein an end of the flexible display panel is attached to the first curved portion, and wherein an end of the polarizing plate is attached to the second and third curved portions while covering the end of the flexible display panel.

10. The flexible display device of claim 1, wherein the polarizing plate is longer than the flexible display panel in a direction extending between the curved portions of the bracket.

11. The flexible display device of claim 1, wherein the cover window is longer than the flexible display panel.

12. A flexible display device comprising:
a bracket having curved portions in lateral sides thereof;
a flexible display panel disposed on an outer side of the bracket and attached to the curved portions of the bracket;
a cover window surrounding an outer side of the flexible display panel; and
a polarizing plate disposed between the flexible display panel and the cover window and covering the curved portions of the bracket,
wherein the curved portions are convex with respect to the lateral sides of the bracket, and wherein the curved portions comprise a first curved portion connected to one plane side and having a first curvature radius and a second curved portion having a second curvature radius that is greater than the first curvature radius and connected to the first curved portion,
wherein an end of the flexible display panel is attached to the first curved portion and wherein an end of the polarizing plate is attached to the second curved portion while covering the end of the flexible display, and
wherein the polarizing plate is longer than the flexible display panel in a direction extending between the curved portions of the bracket.

* * * * *